(12) United States Patent
Van Gompel et al.

(10) Patent No.: US 7,687,370 B2
(45) Date of Patent: Mar. 30, 2010

(54) METHOD OF FORMING A SEMICONDUCTOR ISOLATION TRENCH

(75) Inventors: Toni D. Van Gompel, Austin, TX (US); John J. Hackenberg, Austin, TX (US); Rode R. Mora, Austin, TX (US); Suresh Venkatesan, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 461 days.

(21) Appl. No.: 11/342,102

(22) Filed: Jan. 27, 2006

(65) Prior Publication Data

US 2007/0178661 A1    Aug. 2, 2007

(51) Int. Cl.
*H01L 21/76* (2006.01)
*H01L 21/311* (2006.01)
*H01L 21/302* (2006.01)

(52) U.S. Cl. ............. 438/424; 438/425; 438/700; 438/739; 438/911; 257/E21.549; 257/E21.55; 257/E21.555

(58) Field of Classification Search ......... 438/424, 438/700, 739, 911; 257/E21.549, E21.55
See application file for complete search history.

(56) References Cited

U.S. PATENT DOCUMENTS

| | | | | |
|---|---|---|---|---|
| 4,679,304 A | * | 7/1987 | Bois | 438/426 |
| 5,578,518 A | * | 11/1996 | Koike et al. | 438/424 |
| 5,646,052 A | * | 7/1997 | Lee | 438/426 |
| 5,863,827 A | * | 1/1999 | Joyner | 438/425 |
| 5,880,004 A | * | 3/1999 | Ho | 438/421 |
| 6,033,969 A | * | 3/2000 | Yoo et al. | 438/425 |
| 6,245,684 B1 | * | 6/2001 | Zhao et al. | 438/704 |
| 6,635,945 B1 | * | 10/2003 | Ishitsuka et al. | 257/510 |
| 6,869,849 B2 | * | 3/2005 | Kanamori | 438/296 |
| 6,943,088 B2 | | 9/2005 | Van Bentum et al. | |
| 2005/0054122 A1 | | 3/2005 | Celii et al. | |
| 2005/0054204 A1 | * | 3/2005 | Yu | 438/700 |
| 2005/0056895 A1 | | 3/2005 | Shimizu et al. | |
| 2005/0062127 A1 | | 3/2005 | Chen et al. | |
| 2005/0073002 A1 | | 4/2005 | Tokumitsu | |
| 2005/0079682 A1 | | 4/2005 | Lee et al. | |
| 2005/0079722 A1 | | 4/2005 | Yu | |
| 2005/0104098 A1 | | 5/2005 | Yasuoka et al. | |
| 2005/0106871 A1 | | 5/2005 | Yu | |

* cited by examiner

*Primary Examiner*—Walter L Lindsay, Jr.
*Assistant Examiner*—Ron Pompey
(74) *Attorney, Agent, or Firm*—Robert L. King; Ranjeev Singh

(57) ABSTRACT

A method for forming a semiconductor isolation trench includes forming a pad oxide layer over a substrate and forming a barrier layer over the substrate. A masking layer is formed over the barrier layer and is patterned to form at least one opening in the masking layer. At least a part of the barrier layer and at least a part of the pad oxide layer are etched through the at least one opening resulting in a trench pad oxide layer. Etching of the trench pad oxide layer stops substantially at a top surface of the substrate within the isolation trench. An oxide layer is grown by diffusion on at least the top surface of the substrate corresponding to the at least one isolation trench. The method further includes etching the oxide layer and at least a portion of the substrate to form at least one isolation trench opening.

10 Claims, 4 Drawing Sheets

METHOD OF FORMING A SEMICONDUCTOR ISOLATION TRENCH

FIELD OF THE INVENTION

This invention relates generally to semiconductor devices, and more specifically, to methods of manufacture.

BACKGROUND OF THE INVENTION

Semiconductors traditionally use trench isolation structures to electrically isolate transistors and other devices as needed. The trench isolation is generally an electrical separation in a substrate that physically and electrically isolates one region of a semiconductor die from another. Conventional methods used to form electrical isolation of devices have been by techniques referred to as local oxidation of silicon (LOCOS) or shallow trench isolation (STI). The LOCOS process includes the formation of a masked area of an insulating oxide layer. The LOCOS process is therefore area dependent and not preferred as miniaturization of semiconductors continues. The STI process includes the formation of a trench that physically and electrically separates two semiconductor regions. The STI process is commonly used. A known disadvantage with the STI process is that the top corners of the trench can form an undesired electrical field concentration that negatively changes electrical parameters of the semiconductor. A known technique to reduce the electrical field variation at the corner of the trench is to round the top corners rather than to have sharp angled corners.

Known methods to form trenches with angled corners have various disadvantages. Such disadvantages include the requirement of additional processing steps, such as the formation of trench liners. Additionally, known trench methods have variability in the magnitude of the corner rounding due to liner thickness variations. At small processing dimensions such variations are critical.

BRIEF DESCRIPTION OF THE DRAWINGS

The present invention is illustrated by way of example and not limited to the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
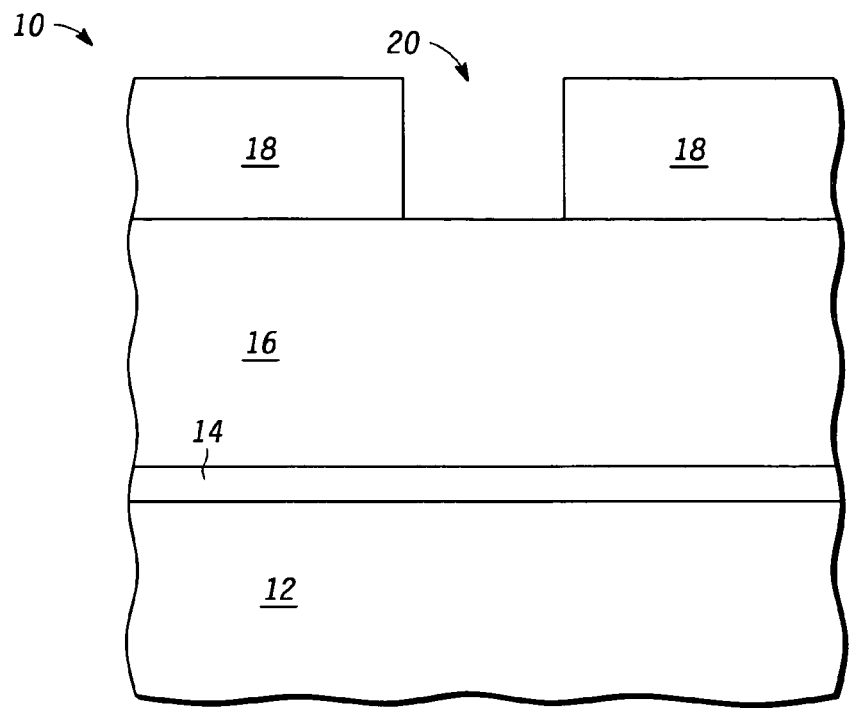
FIGS. 1-5 illustrate in cross-sectional form a method of forming a trench isolation structure in accordance with one embodiment.

Illustrated in FIG. 1 is a semiconductor device 10 having a substrate 12. In one form the substrate 12 is a bulk layer of silicon. In another form, the substrate 12 is a layer of silicon that is supported by an insulator (not shown) to form a device commonly referred to as a silicon on insulator (SOI) device. In other forms the substrate 12 is formed of other materials than silicon. For example substrate 12 may be silicon germanium, germanium or other semiconductor materials. Overlying the substrate 12 is a pad oxide layer 14. In one form the pad oxide layer 14 is silicon dioxide. However it should be understood that pad oxide layer 14 may be implemented with any of various insulating materials. Overlying the pad oxide layer 14 is a barrier layer 16. The barrier layer 16 in one form is silicon nitride but may be other types of protective materials. Overlying the barrier layer 16 is a patterned masking layer 18. The patterned masking layer 18 in one form is photoresist. An isolation opening 20 is provided in the patterned masking layer 18 at a position within the semiconductor device 10 desired to form an isolation trench.

Figure 2:
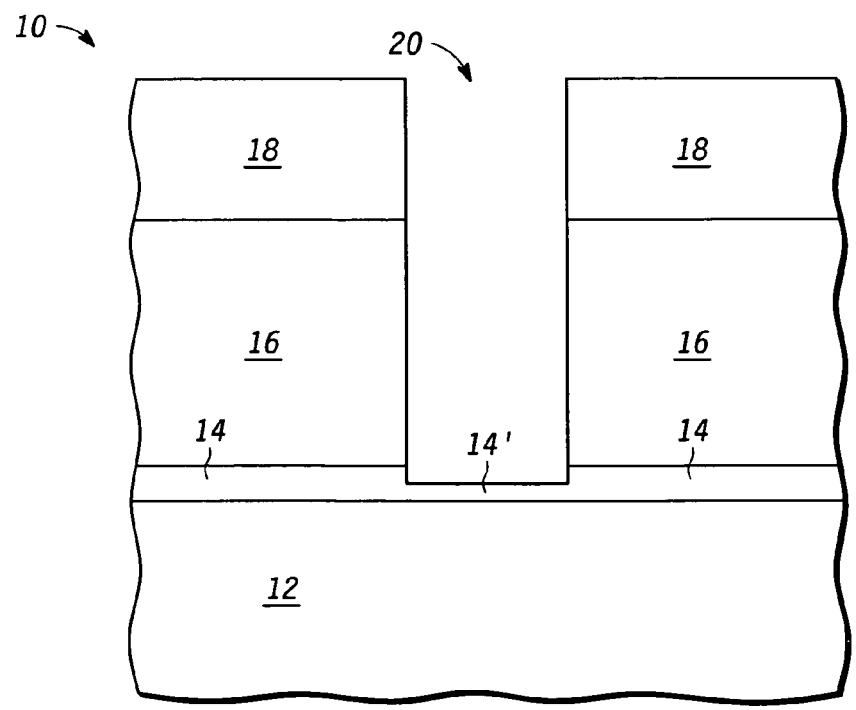

Illustrated in FIG. 2 is further processing of a trench within semiconductor device 10. In one form the processing will utilize three distinct material removal steps. In particular, a conventional dry etch is employed as a first removal step to form a trench by extending the isolation opening 20 through the barrier layer 16 and through a portion of the material of the underlying layer 14. In particular a remaining pad oxide layer 14' is exposed within the isolation opening 20. The amount of remaining pad oxide layer 14' is determined by emission detection when etching of the pad oxide layer 14 begins. Once the removal of pad oxide layer 14 begins, a timed etch may then be performed to etch only a predetermined portion of the pad oxide layer 14.

Figure 3:
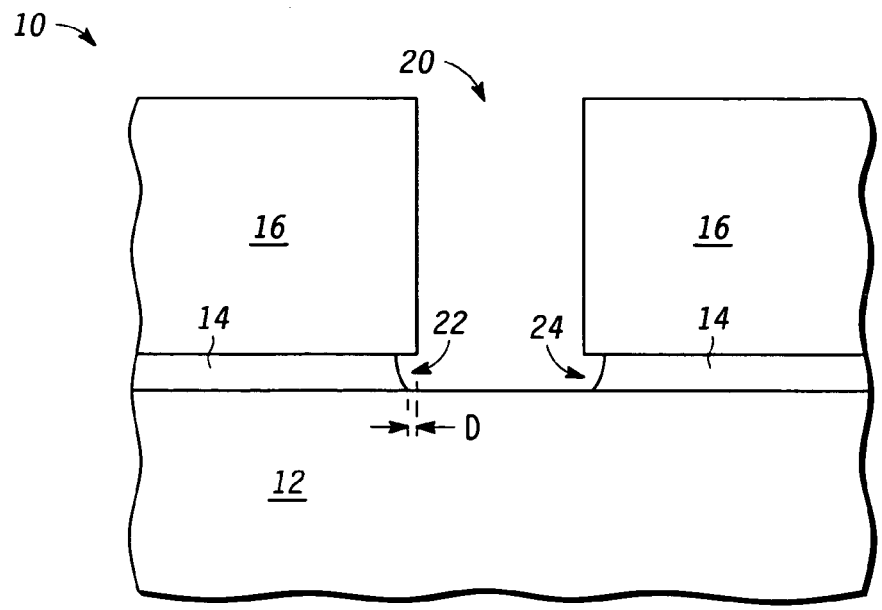

Illustrated in FIG. 3 is further processing of the trench within the semiconductor device 10. A second removal step is used to remove the remaining pad oxide layer 14'. In particular, a conventional isotropic etch is used to remove the remaining pad oxide layer 14' as a second removal step. The isotropic etch to remove the remaining oxide layer 14' also etches laterally into exposed surfaces of the pad oxide layer 14. The lateral etching of pad oxide layer 14 creates an offset of dimension D at the surface of substrate 12. In other words, the isotropic etch moves the pad oxide edge by distance D from the edge of the barrier layer 16. As a result, a pad oxide layer recess 22 is formed. On the opposite side of the trench is formed a pad oxide layer recess 24. The size of the pad oxide layer recesses 22 and 24 are directly related to the etch and are used, in part, to determine the properties of rounded corners to be subsequently formed within the trench. It should be noted that no etching into the substrate 12 occurs in connection with the first removal step and the second removal step.

Figure 4:
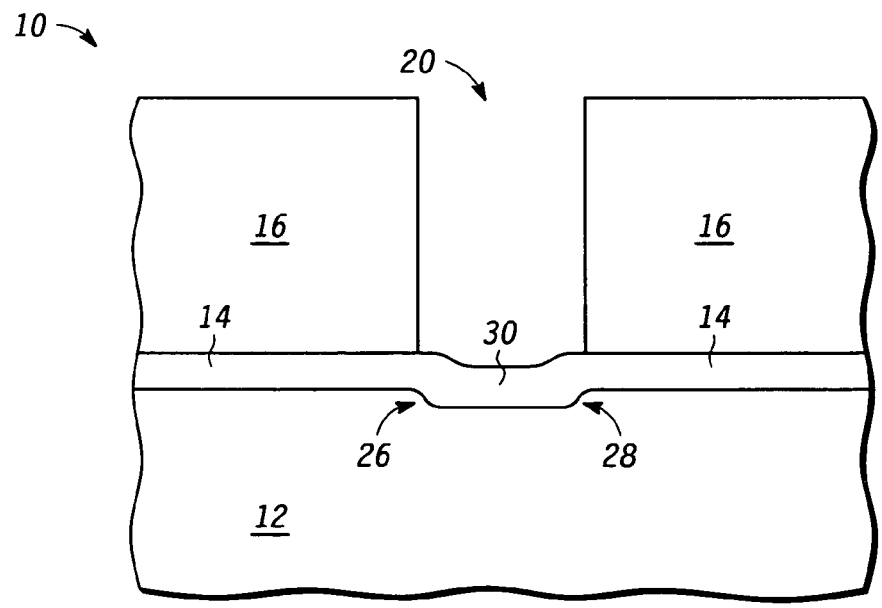

Illustrated in FIG. 4 is further processing of the trench within the semiconductor device 10. A diffusion step is implemented by subjecting the semiconductor device 10 to a high temperature anneal. In one form an anneal within the range of seven hundred degrees Celsius to eleven hundred degrees Celsius is implemented. It should be apparent that other temperatures may be used to perform the diffusion. As a result of the diffusion, a diffusion oxide 30 is formed on the exposed surfaces of the substrate 12 and within the trench of semiconductor device 10. When substrate 12 is implemented with silicon, the diffusion functions to modify the exposed silicon of substrate 12 into silicon dioxide. It should be noted that the upper surface of diffusion oxide 30 is not planar. In particular, the edges bulge or are taller than the central region of diffusion oxide 30. The reason for the non-planarity is the size and curvature of the pad oxide layer recesses 22 and 24. As a result of the diffusion, the lower surface of diffusion oxide 30 underlying the edge of the barrier layer 16 is rounded to form a rounded corner 26 and a rounded corner 28. The corner rounding is provided in part as a result of the oxidation of the silicon within substrate 12 during the diffusion. The curvature of rounded corner 26 and rounded corner 28 is largely determined by the length of time of the diffusion.

Figure 5:
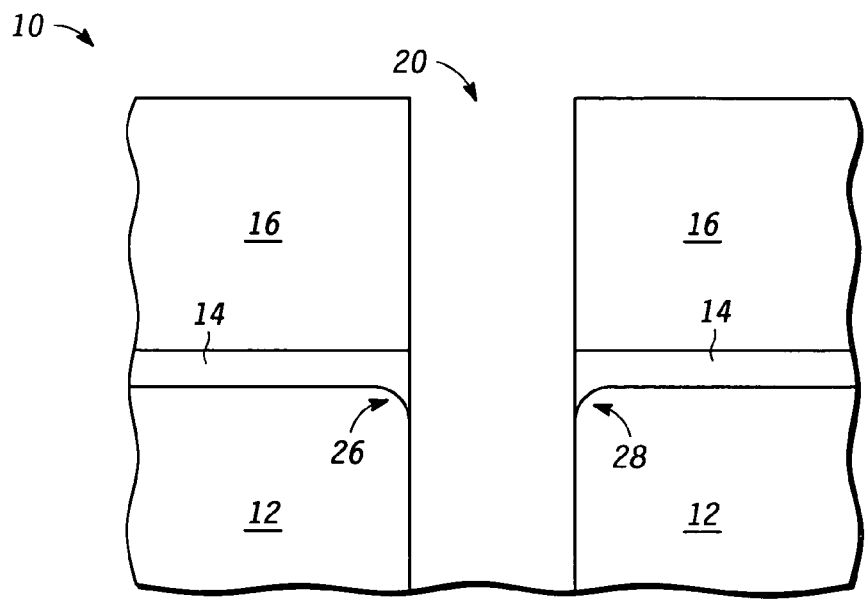

Illustrated in FIG. 5 is further processing of the trench within the semiconductor device 10. The isolation opening 20 is further created by a third removal step in the method. A conventional dry etch is performed to remove the diffusion oxide 30 within the trench. Once the diffusion oxide 30 is removed, all exposed surfaces of the substrate 12 are removed. In particular, a trench is formed within the isolation opening that completely physically separates the substrate 12 into two portions when the substrate 12 is on an insulator (not shown). When substrate 12 is implemented as a bulk layer of the semiconductor device 10, the depth of the trench etch determines the amount of electrical separation between adjacent left and right halves of semiconductor device 10.

Figure 6:
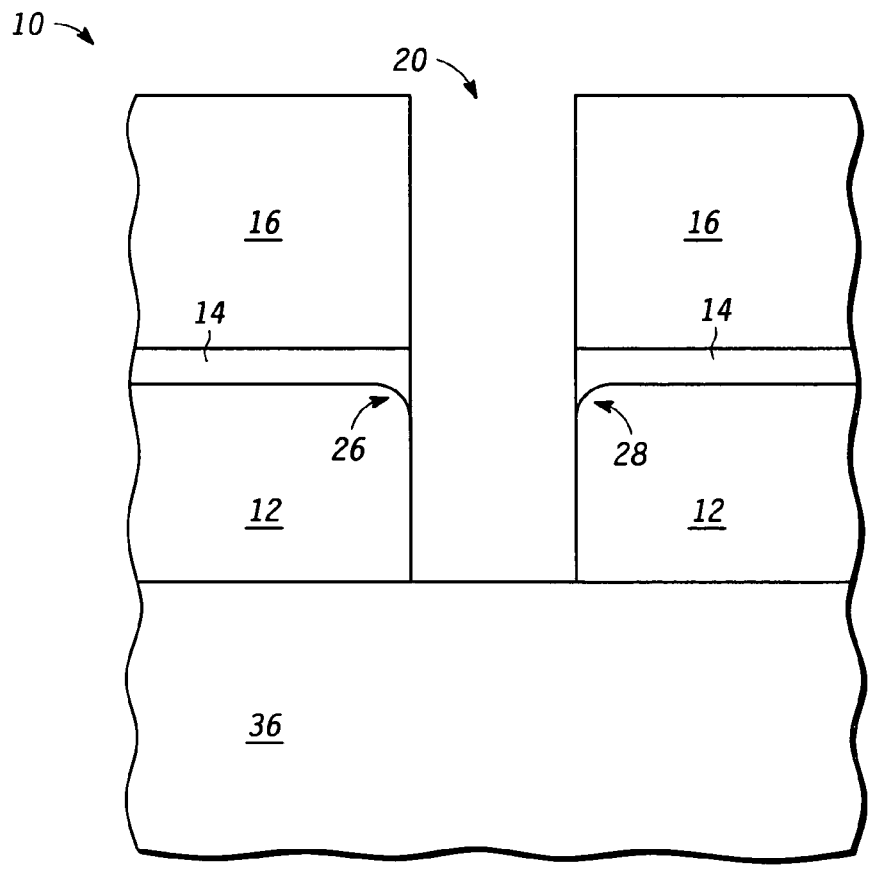
FIG. 6 illustrates in cross-sectional form a trench isolation structure formed as a silicon-on-insulator device.

Illustrated in FIG. 6 is further processing of the trench within semiconductor device 10 wherein the substrate 12 is positioned directly on an insulator 36. Therefore, semiconductor device 10, in this form, is implemented as an SOI device. Reference numbers that are common between FIG. 6 and the previous figures are numbered the same for convenience of explanation. It should be understood that insulator 36 is typically attached to substrate 12 at the beginning of the process as described in FIG. 1.

Figure 7:
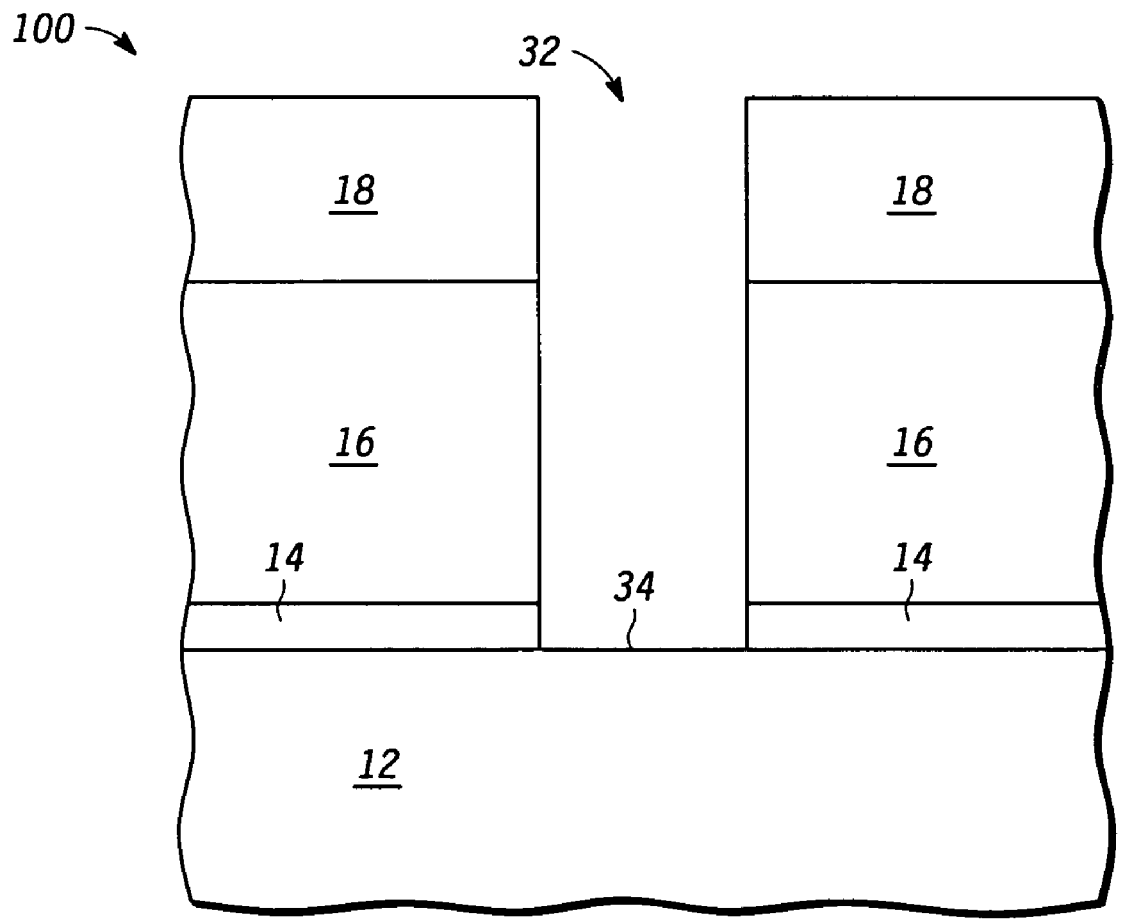
FIG. 7 illustrates in cross-sectional form another form of the present invention.

Illustrated in FIG. 7 is another form of the present invention. In particular, a semiconductor device 100 is formed having a trench using a two step removal process. In this form, instead of the processing illustrated in FIG. 2, the processing illustrated in FIG. 7 is performed. After the processing of FIG. 7, the processing of FIGS. 3-5 is performed. In this form, there is no remaining pad oxide 14 in the isolation opening 32. It should be noted that the creation of isolation opening 32 is performed without removing substantially any of the substrate 12. In other words the etch accurately stops at the top 34 of substrate surface 12. An accurate etch may be implemented in one of several methods. In one form a dry etch is performed with masking layer 18 wherein endpoint detection is used to determine accurately when the etching of pad oxide layer 14 begins. At this point a conventional highly selective timed etch is used to determine when to stop without removing any of substrate 12. At the conclusion of the processing of FIG. 7, a clean processing step is implemented wherein an isotropic etch is used to laterally notch the exposed surfaces of pad oxide 14 adjacent the isolation opening 32. At this point a structure as illustrated in FIG. 3 is achieved. From that point the processing is analogous to accomplish the trench structure of either FIG. 5 or FIG. 6 may be implemented.

It should be noted that it is important that the formation of isolation opening 32 is implemented without removing substantially any of the substrate 12. Because the etch accurately stops at the top 34 of substrate 12 there is no significant extension of the trench into substrate 12. If there is significant extension into the trench, the subsequent oxidation along the sidewalls of the substrate portion of the trench would change the critical dimension of the trench isolation. For example, the width of the trench would be expanded to a size greater than the originally intended width. Additional processing of the trench through the substrate 12 would have a non-desired multi-faceted or nonlinear sidewall.

In the foregoing specification, the invention has been described with reference to specific embodiments. However, one of ordinary skill in the art appreciates that various modifications and changes can be made without departing from the scope of the present invention as set forth in the claims below. For example, the various materials may be used. Other types of etching may be used to accurately etch only to a top surface of the substrate 12. For example, various etch chemistries can be used to implement accurate endpoint detection so that an etch of the pad oxide layer 14 may be accomplished in the trench without removing substantially any of the substrate material. It should be understood throughout that a very small amount of removal of the substrate 12 may occur on the order of several atomic layers.

In one form there is herein provided a method for forming a semiconductor isolation trench by forming a pad oxide layer over a substrate. A barrier layer is formed over the pad oxide layer. A masking layer is formed over the barrier layer. The masking layer is patterned to form at least one opening in the masking layer. At least a part of the barrier layer and at least a part of the pad oxide layer are etched through the at least one opening resulting in a trench pad oxide layer. Etching of the trench pad oxide layer is stopped substantially at a top surface of the substrate corresponding to at least one isolation trench. An oxide layer is grown on at least the top surface of the substrate corresponding to the at least one isolation trench. The oxide layer and at least a portion of the substrate are etched to form at least one isolation trench opening. In one form at least the top surface of the substrate corresponding to the at least one isolation trench has a first corner and a second corner. In one form growing the oxide layer on at least the top surface of the substrate that corresponds to the at least one isolation trench results in a rounding of the first corner and the second corner of the at least one top surface of the substrate. In another form etching the at least part of the barrier layer and the at least the part of the pad oxide layer is performed using a dry etch process. In another form etching the trench pad oxide layer is performed using an isotropic etch process. In another form etching the trench pad oxide layer further comprises etching a first portion and a second portion of the at least the part of the pad oxide layer underlying the barrier layer. In another form etching the first portion and the second portion comprises etching the first portion to a predetermined width and etching the second portion to the predetermined width. In another form the predetermined width is selected to control a radius of the curvature of the first corner and the second corner. In another form the oxide layer has a thickness further comprising selecting the thickness of the oxide layer to control a radius of the curvature of the first corner and the second corner. In another form growing the oxide layer is implemented by diffusing oxygen into the at least the top surface of the substrate corresponding to the at least one isolation trench. In another form the substrate is one of a silicon-on-insulator substrate or a bulk substrate. In one form the substrate is at least one of silicon, germanium, or a combination thereof.

In another form there is provided a method for forming a semiconductor isolation trench. A pad oxide layer is formed over a substrate. A barrier layer is formed over the pad oxide layer. A masking layer is formed over the barrier layer. The masking layer is patterned to form at least one opening in the masking layer. At least a part of the barrier layer and at least a part of the pad oxide layer are etched through the at least one opening. The etching is stopped at a top surface of the substrate corresponding to at least one isolation trench. An oxide layer is grown on at least the top surface of the substrate corresponding to the at least one isolation trench. The oxide layer and at least a portion of the substrate are etched to form at least one isolation trench opening. In another form at least the top surface of the substrate corresponding to the at least one isolation trench has a first corner and a second corner. In another form the growing of the oxide layer on at least the top surface of the substrate that corresponds to the at least one isolation trench results in a rounding of the first corner and the second corner. In another form etching the at least part of the barrier layer and the at least the part of the pad oxide layer is performed using a dry etch process. In another form growing the oxide layer is implemented by diffusing oxygen into the at least the top surface of the substrate corresponding to the at least one isolation trench. In another form the substrate is one of a silicon-on-insulator substrate or a bulk substrate. In yet another form the substrate is at least one of silicon, germanium, or a combination thereof.

In another form there is herein provided a method for forming a semiconductor isolation trench. A substrate with a pad oxide layer is provided over the substrate and a barrier layer is provided over the pad oxide layer. A masking layer is formed over the barrier layer. The masking layer is patterned to form at least one opening in the masking layer. At least a part of the barrier layer and at least a part of the pad oxide layer are etched through the at least one opening resulting in a trench pad oxide layer. Etching of the trench pad oxide layer is stopped substantially at a top surface of the substrate corresponding to at least one isolation trench. An oxide layer is grown on at least the top surface of the substrate corresponding to the at least one isolation trench. The oxide layer and at least a portion of the substrate are etched to form at least one isolation trench opening.

Accordingly, the specification and figures are to be regarded in an illustrative rather than a restrictive sense, and all such modifications are intended to be included within the scope of the present invention. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. A method for forming a semiconductor isolation trench comprising the sequential steps of:
    forming a pad oxide layer over a substrate;
    forming a barrier layer over the pad oxide layer;
    forming a masking layer over the barrier layer;
    patterning the masking layer to form at least one opening in the masking layer;
    etching at least a part of the barrier layer and at least a part of the pad oxide layer through the at least one opening and stopping the etching at a top surface of the substrate without etching into the substrate to form at least one isolation trench, said etching also laterally etching into exposed surfaces of the pad oxide layer to create an offset at the top surface of the substrate and recess the pad oxide layer at the top surface of the substrate;
    growing an oxide layer on at least the top surface of the substrate corresponding to the at least one isolation trench wherein edges of the oxide layer are taller than a central region of the oxide layer within the at least one isolation trench; and
    etching the oxide layer and at least a portion of the substrate to form at least one isolation trench opening.

2. The method of claim 1, wherein the at least the top surface of the substrate corresponding to the at least one isolation trench has a first corner and a second corner.

3. The method of claim 2, wherein the step of growing the oxide layer on at least the top surface of the substrate corresponding to the at least one isolation trench results in a rounding of the first corner and the second corner of the at least one top surface of the substrate.

4. The method of claim 1, wherein the step of etching the at least part of the barrier layer and the at least the part of the pad oxide layer is performed using a dry etch process to determine with endpoint detection when etching of the pad oxide layer begins, and using a timed etch to determine when to stop etching without removing the substrate, followed by an isotropic etch to recess the pad oxide layer at the top surface of the substrate.

5. The method of claim 1, wherein the substrate comprises at least one of silicon, germanium, or a combination thereof.

6. A method for forming a semiconductor isolation trench comprising the sequential steps of:
    forming a pad oxide layer over a bulk substrate;
    forming a barrier layer over the pad oxide layer;
    forming a masking layer over the barrier layer;
    patterning the masking layer to form at least one opening in the masking layer;
    etching an exposed portion of the barrier layer and the pad oxide layer through the at least one opening to remove the pad oxide layer in the at least one opening, and stopping the etching at a top surface of the bulk substrate without etching into the bulk substrate to form an isolation trench, said etching also laterally etching into exposed surfaces of the pad oxide layer to create an offset at the top surface of the substrate and recess the pad oxide layer at the top surface of the substrate to form recesses;
    growing an oxide layer on at least the top surface of the bulk substrate within the isolation trench and in the recesses, wherein edges of the oxide layer are taller than a central region of the oxide layer within the at least one isolation trench due to the recesses; and
    etching the oxide layer and at least a portion of the substrate to form at least one isolation trench opening.

7. The method of claim 6, wherein the at least the top surface of the bulk substrate corresponding to the at least one isolation trench has a first corner and a second corner.

8. The method of claim 7, wherein the step of growing the oxide layer on at least the top surface of the bulk substrate corresponding to the at least one isolation trench results in a rounding of the first corner and the second corner of the at least one top surface of the bulk substrate.

9. The method of claim 6, wherein the step of etching the at least part of the baffler layer and the at least the part of the pad oxide layer is performed using a dry etch process to determine with endpoint detection when etching of the pad oxide layer begins, and using a timed etch to determine when to stop etching without removing the substrate, followed by an isotropic etch to recess the pad oxide layer at the top surface of the substrate.

10. The method of claim 6, wherein the bulk substrate comprises at least one of silicon, germanium, or a combination thereof.

* * * * *